United States Patent
Britt et al.

(10) Patent No.: US 9,640,705 B2
(45) Date of Patent: *May 2, 2017

(54) FEEDBACK FOR BUFFER LAYER DEPOSITION

(71) Applicant: Global Solar Energy, Inc., Tucson, AZ (US)

(72) Inventors: Jeffrey S. Britt, Tucson, AZ (US); Scot Albright, Tucson, AZ (US); Urs Schoop, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/709,262

(22) Filed: May 11, 2015

(65) Prior Publication Data

US 2015/0263213 A1    Sep. 17, 2015

Related U.S. Application Data

(63) Continuation of application No. 12/397,899, filed on Mar. 4, 2009, now abandoned.

(60) Provisional application No. 61/068,456, filed on Mar. 5, 2008.

(51) Int. Cl.
| | | |
|---|---|---|
| *B05D 5/12* | (2006.01) | |
| *H01L 31/18* | (2006.01) | |
| *C23C 18/12* | (2006.01) | |
| *H01L 31/0392* | (2006.01) | |

(Continued)

(52) U.S. Cl.
CPC ............. *H01L 31/18* (2013.01); *C23C 18/12* (2013.01); *H01L 31/0322* (2013.01); *H01L 31/03928* (2013.01); *H01L 31/0749* (2013.01); *H01L 31/1836* (2013.01); *Y02E 10/541* (2013.01); *Y02P 70/521* (2015.11)

(58) Field of Classification Search
CPC combination set(s) only.
See application file for complete search history.

(56) References Cited

U.S. PATENT DOCUMENTS

| | | |
|---|---|---|
| 3,148,084 A | 9/1964 | Hill et al. |
| 4,043,296 A | 8/1977 | Chu et al. |
| 4,143,235 A | 3/1979 | Duisman |

(Continued)

FOREIGN PATENT DOCUMENTS

| | | | |
|---|---|---|---|
| JP | 7-133102 A | 5/1995 | |
| JP | 2003-249673 A | 9/2003 | |

(Continued)

OTHER PUBLICATIONS

Tsui et al., "Techniques for Combinatorial Molecular Beam Epitaxy"; Review of Scientific Instruments, vol. 76; May 18, 2005.

(Continued)

*Primary Examiner* — Austin Murata
(74) *Attorney, Agent, or Firm* — Kolisch Hartwell, P.C.

(57) ABSTRACT

Improved methods and apparatus for forming thin film layers of chalcogenide on a substrate web. According to the present teachings, a feedback control system may be employed to measure one or more properties of the web and/or the chalcogenide layer, and to adjust one or more parameters of the system or buffer layer deposition method in response to the measurement.

18 Claims, 3 Drawing Sheets

(51) Int. Cl.
*H01L 31/0749* (2012.01)
*H01L 31/032* (2006.01)

(56) References Cited

U.S. PATENT DOCUMENTS

| | | | |
|---|---|---|---|
| 4,204,933 A | 5/1980 | Barlow et al. | |
| 4,366,337 A | 12/1982 | Alessandrini et al. | |
| 4,642,140 A | 2/1987 | Noufi et al. | |
| 4,673,801 A | 6/1987 | Leary et al. | |
| 4,778,478 A | 10/1988 | Barnett | |
| 5,112,410 A | 5/1992 | Chen | |
| 5,396,080 A | 3/1995 | Hannotiau et al. | |
| 5,578,502 A | 11/1996 | Albright et al. | |
| 6,105,899 A * | 8/2000 | Harris | B65H 23/038 226/23 |
| 6,109,912 A | 8/2000 | Robinson et al. | |
| 6,126,740 A * | 10/2000 | Schulz | C30B 29/46 117/4 |
| 6,238,808 B1 * | 5/2001 | Arao | C25D 9/08 136/256 |
| 6,258,620 B1 | 7/2001 | Morel et al. | |
| 6,268,014 B1 | 7/2001 | Eberspacher et al. | |
| 6,281,098 B1 | 8/2001 | Wang et al. | |
| 6,310,281 B1 | 10/2001 | Wendt et al. | |
| 6,350,489 B1 | 2/2002 | Moriyama et al. | |
| 6,372,538 B1 | 4/2002 | Wendt et al. | |
| 6,417,027 B1 | 7/2002 | Akram | |
| 6,428,851 B1 | 8/2002 | Friedersdorf et al. | |
| 6,537,845 B1 | 3/2003 | McCandless et al. | |
| 7,172,793 B2 | 2/2007 | Cohu | |
| 7,194,197 B1 | 3/2007 | Wendt et al. | |
| 7,306,823 B2 | 12/2007 | Sager et al. | |
| 7,393,516 B2 | 7/2008 | Seo et al. | |
| 8,062,922 B2 | 11/2011 | Britt et al. | |
| 2002/0159019 A1 | 10/2002 | Pokorny et al. | |
| 2003/0011047 A1 * | 1/2003 | Cunningham | H01L 31/02168 257/614 |
| 2003/0059526 A1 | 3/2003 | Benson et al. | |
| 2003/0082834 A1 | 5/2003 | Delahoy | |
| 2003/0142169 A1 | 7/2003 | Maeng et al. | |
| 2004/0067321 A1 | 4/2004 | Kondo et al. | |
| 2005/0115502 A1 | 6/2005 | George et al. | |
| 2005/0158909 A1 | 7/2005 | Milliron et al. | |
| 2005/0271827 A1 | 12/2005 | Krunks et al. | |
| 2005/0278163 A1 | 12/2005 | Poplack et al. | |
| 2006/0019333 A1 | 1/2006 | Rodgers et al. | |
| 2006/0019427 A1 | 1/2006 | Cao | |
| 2006/0062902 A1 | 3/2006 | Sager et al. | |
| 2006/0096537 A1 | 5/2006 | Tuttle | |
| 2006/0163207 A1 | 7/2006 | Lee et al. | |
| 2006/0278163 A1 | 12/2006 | Ovshinsky et al. | |
| 2007/0110836 A1 | 5/2007 | Fork et al. | |
| 2007/0122936 A1 | 5/2007 | Park et al. | |
| 2007/0166453 A1 | 7/2007 | Van Duren et al. | |
| 2007/0169809 A1 | 7/2007 | Van Duren et al. | |
| 2007/0227633 A1 | 10/2007 | Basol | |
| 2007/0243657 A1 | 10/2007 | Basol et al. | |
| 2007/0253686 A1 | 11/2007 | Wendt et al. | |
| 2008/0153268 A1 | 6/2008 | Johnston et al. | |
| 2008/0175982 A1 | 7/2008 | Robinson et al. | |
| 2008/0213467 A1 | 9/2008 | Yu et al. | |
| 2008/0300323 A1 | 12/2008 | Caldwell et al. | |
| 2009/0047114 A1 * | 2/2009 | Yokoyama | B65H 20/02 414/806 |
| 2009/0077805 A1 | 3/2009 | Bachrach et al. | |
| 2009/0120359 A1 | 5/2009 | Roussillon et al. | |
| 2009/0258457 A1 | 10/2009 | Britt et al. | |
| 2009/0301550 A1 | 12/2009 | Hunt et al. | |
| 2009/0305449 A1 * | 12/2009 | Bollman | B32B 15/01 438/57 |
| 2010/0091281 A1 * | 4/2010 | Suzuki | G02F 1/1303 356/364 |
| 2012/0034726 A1 | 2/2012 | Britt et al. | |

FOREIGN PATENT DOCUMENTS

| | | |
|---|---|---|
| JP | 2004-158561 A | 6/2004 |
| JP | 2007-160304 A | 6/2007 |
| JP | 2009-528680 A | 8/2009 |
| WO | 2005086238 A1 | 9/2005 |
| WO | 2007101099 A2 | 9/2007 |
| WO | 2009111052 A1 | 9/2009 |
| WO | 2009111053 A2 | 9/2009 |
| WO | 2009111055 A1 | 9/2009 |

OTHER PUBLICATIONS

Jun. 17, 2009, International Search Report of the the International Searching Authority from the U.S. Receiving Office, in PCT Patent Application No. PCT/US2009/001429, which is an international patent application of Applicant Hanergy Hi-Tech Power (HK) Limited.

Jun. 17, 2009, Written Opinion of the the International Searching Authority from the U.S. Receiving Office, in PCT Patent Application No. PCT/US2009/001429, which is an international patent application of Applicant Hanergy Hi-Tech Power (HK) Limited.

Jun. 19, 2009, International Search Report of the International Searching Authority from the U.S. Receiving Office, in PCT Patent Application No. PCT/US2009/001432, which is an international patent application that shares the same priority as this U.S. application.

Jun. 19, 2009, Written Opinion of the International Searching Authority from the U.S. Receiving Office, in PCT Patent Application No. PCT/US2009/001432, which is an international patent application that shares the same priority as this U.S. application.

Jun. 25, 2009, International Search Report of the International Searching Authority from the U.S. Receiving Office, in PCT Patent Application No. PCT/US2009/001427, which is an international patent application of Applicant Hanergy Hi-Tech Power (HK) Limited.

Jun. 25, 2009, Written Opinion of the International Searching Authority from the U.S. Receiving Office, in PCT Patent Application No. PCT/US2009/001427, which is an international patent application of Applicant Hanergy Hi-Tech Power (HK) Limited.

Sep. 7, 2010, International Preliminary Report on Patentability from the International Bureau of WIPO, in PCT/US2009/001427, which is an international patent application of Applicant Hanergy Hi-Tech Power (HK) Limited.

Sep. 7, 2010, International Preliminary Report on Patentability from the International Bureau of WIPO, in PCT/US2009/001429, which is an international patent application of Applicant Hanergy Hi-Tech Power (HK) Limited.

Sep. 7, 2010, International Preliminary Report on Patentability from the International Bureau of WIPO, in PCT/US2009/001432, which is an international patent application that shares the same priority as this U.S. application.

Jun. 20, 2011, Office action from the U.S. Patent and Trademark Office, in U.S. Appl. No. 12/397,846, which is another application of Applicant Hanergy Hi-Tech Power (HK) Limited.

Nov. 16, 2011, Office action from the U.S. Patent and Trademark Office, in U.S. Appl. No. 12/397,873, which is another application of Applicant Hanergy Hi-Tech Power (HK) Limited.

Jan. 10, 2012, Office action from the U.S. Patent and Trademark Office, in U.S. Appl. No. 12/397,863, which is another application of Applicant Hanergy Hi-Tech Power (HK) Limited.

Mar. 5, 2012, International Search Report of the International Searching Authority from the U.S. Receiving Office, in PCT Patent Application No. PCT/US2009/001428, which is an international patent application of Applicant Hanergy Hi-Tech Power (HK) Limited.

Mar. 5, 2012, Written Opinion of the International Searching Authority from the U.S. Receiving Office, in PCT Patent Application No. PCT/US2009/001428, which is an international patent application of Applicant Hanergy Hi-Tech Power (HK) Limited.

(56) References Cited

OTHER PUBLICATIONS

Mar. 8, 2012, Office action from the U.S. Patent and Trademark Office, in U.S. Appl. No. 12/397,899, which shares the same priority as this U.S. application.
Apr. 11, 2012, International Preliminary Report on Patentability from the International Bureau of WIPO, in PCT/US2009/001428, which is an international patent application of Applicant Hanergy Hi-Tech Power (HK) Limited.
Sep. 27, 2012, Office action from the U.S. Patent and Trademark Office, in U.S. Appl. No. 12/397,899, which shares the same priority as this U.S. application.
Jun. 12, 2013, Office action from the U.S. Patent and Trademark Office, in U.S. Appl. No. 13/273,013, which is another application of Applicant Hanergy Hi-Tech Power (HK) Limited.
Jun. 18, 2013, Office action from the Japanese Patent Office, in Japanese Patent Application No. 2010-549667, which is a foreign patent application of Applicant Hanergy Hi-Tech Power (HK) Limited.
Jun. 18, 2013, Office action from the Japanese Patent Office, in Japanese Patent Application No. 2010-549668, which is a foreign patent application of Applicant Hanergy Hi-Tech Power (HK) Limited.
Jun. 18, 2013, Office action from the U.S. Patent and Trademark Office, in U.S. Appl. No. 12/397,899, which shares the same priority as this U.S. application.
Mar. 11, 2014, Office action from the U.S. Patent and Trademark Office, in U.S. Appl. No. 12/397,899, which shares the same priority as this U.S. application.
May 22, 2014, Office action from the U.S. Patent and Trademark Office, in U.S. Appl. No. 13/273,013, which is another application of Applicant Hanergy Hi-Tech Power (HK) Limited.
May 26, 2015, Office action from the Japanese Patent Office, in Japanese Patent Application No. 2010-549668, which is a foreign patent application of Applicant Hanergy Hi-Tech Power (HK) Limited.
Dec. 8, 2014, Office action from the Japanese Patent Office, in Japanese Patent Application No. 2010-549668, which is a foreign patent application of Applicant Hanergy Hi-Tech Power (HK) Limited.
Jan. 21, 2015, Office action from the U.S. Patent and Trademark Office, in U.S. Appl. No. 13/273,013, which is another application of Applicant Hanergy Hi-Tech Power (HK) Limited.
Feb. 13, 2015, Office action from the U.S. Patent and Trademark Office, in U.S. Appl. No. 12/397,899, which shares the same priority as this U.S. application.
Jun. 3, 2015, Office action from the U.S. Patent and Trademark Office, in U.S. Appl. No. 13/273,013, which is another application of Applicant Hanergy Hi-Tech Power (HK) Limited.
Aug. 4, 2015, Extended European Search Report from the European Patent Office, in European Patent Application No. 09717247.2, which is a foreign patent application of Applicant Hanergy Hi-Tech Power (HK) Limited.

* cited by examiner

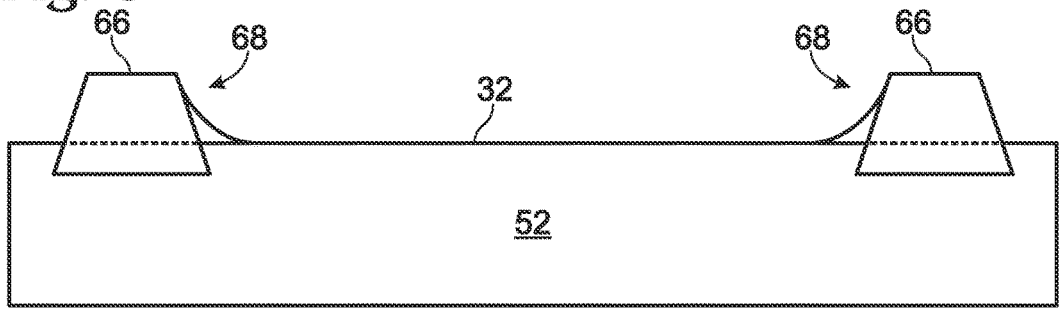
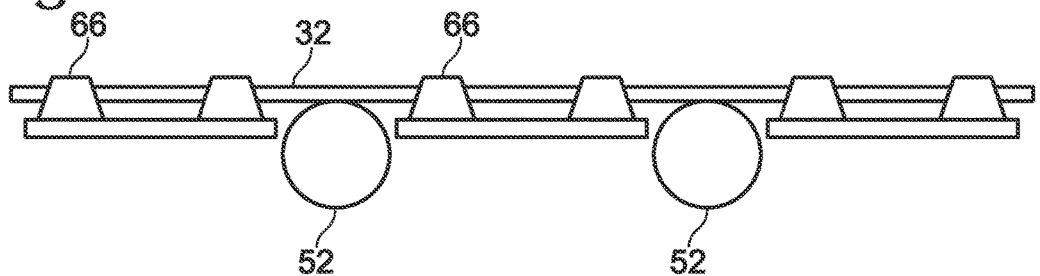
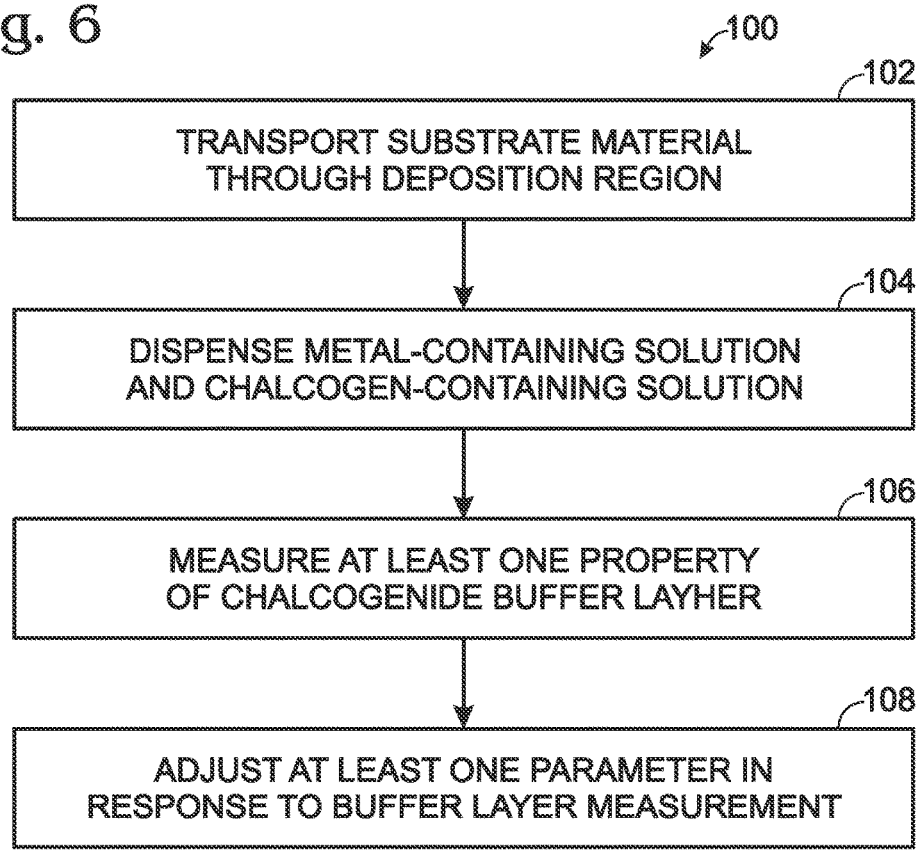

FEEDBACK FOR BUFFER LAYER DEPOSITION

CROSS-REFERENCE TO RELATED APPLICATIONS

This application is a continuation of U.S. patent application Ser. No. 12/397,899, filed Mar. 4, 2009, which claims priority from U.S. Provisional Patent Application Ser. No. 61/068,456, filed on Mar. 5, 2008, each of which is hereby incorporated by reference in their entirety.

BACKGROUND

The field of photovoltaics generally relates to multi-layer materials that convert sunlight directly into DC electrical power. The basic mechanism for this conversion is the photovoltaic effect, first observed by Antoine-Cesar Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (GIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics. Therefore, a need exists for improved methods and apparatus for depositing thin-film layers onto a non-rigid, continuous substrate.

A particular type of n-type semiconductor material that may be used in thin-film PV cells is known in the field of chemistry as a chalcogenide. A chalcogenide is a chemical compound consisting of at least one chalcogen ion and at least one more electropositive element such as a metal. Forming a thin film of chalcogenide is described in the prior art, for example, in U.S. Pat. No. 6,537,845 to McCandless et al., which is hereby incorporated into the present disclosure by reference for all purposes. However, forming chalcogenide films having a desired thickness and uniformity remains technically challenging. For example, some methods of chalcogenide formation involve depositing reactant solutions on stationary substrates, and methods of this type may have efficiency and speed limitations. Other methods may deposit reactants on a moving substrate, while dragging the substrate over a conductive heater. This may lead to non-uniform motion of the substrate (e.g., due to friction with the heater), non-uniform heating of the substrate, and/or other issues resulting in undesirable non-uniformities in the chalcogenide buffer layer. Furthermore, holding portions of the web down onto a conductive heater (e.g., to maintain flatness while lifting the web edges for solution containment purposes) may result in localized hot spots on the web, resulting in additional non-uniformities in the substrate temperature and chalcogenide layer thickness.

It is known in the art to evaluate the color of a deposited chalcogenide layer, and to adjust parameters of the deposition system, such as temperature or solution flow rate, in response. However, the evaluation of color is generally performed manually by an operator inspecting the deposited chalcogenide layer, either directly or in an image transmitted to a viewable monitor by a camera. This type of manual feedback is limited by the time required to perform an inspection and respond appropriately, by inherent inaccuracies in an operator's evaluation of color, and by the ability of the operator to correctly adjust the necessary parameters of the deposition system in response. It is therefore desirable to develop improved methods to measure properties of a deposited chalcogenide layer and to provide feedback that may be used to more accurately and efficiently adjust parameters of the deposition system.

SUMMARY

The present teachings disclose improved methods and apparatus for forming thin film buffer layers of chalcogenide on a substrate web. According to the present teachings, a feedback control system may be employed to measure one or more properties of the web and/or the chalcogenide layer, and to adjust one or more parameters of the system or deposition method in response.

BRIEF DESCRIPTION OF THE DRAWINGS

FIG. 3 is a partial sectional view of lateral support surfaces lifting transverse edge portions of a substrate web.

FIG. 4 is a partial side elevational view of transverse edge portions of a substrate web being lifted by lateral support surfaces, while the web is transported by transport rollers.

FIG. 6 is a flow chart depicting a method of forming a thin-film layer on a substrate web.

DETAILED DESCRIPTION

I. Introduction

Figure 1:
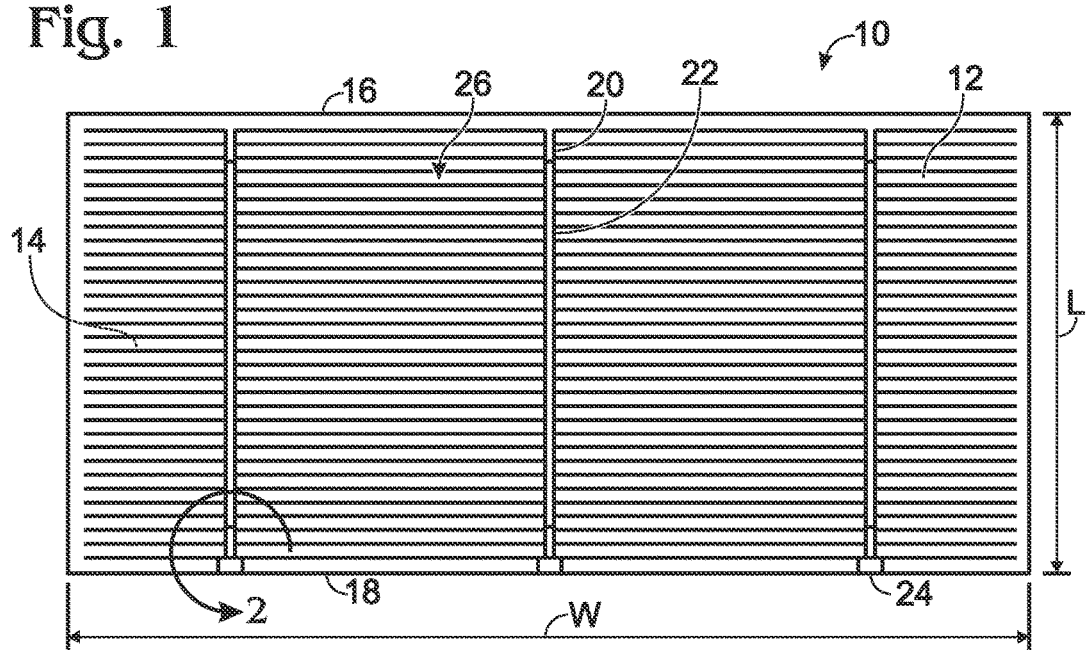
FIG. 1 is a top view of a thin film photovoltaic cell, according to aspects of the present disclosure.

Manufacture of flexible thin-film PV cells may proceed by a roll-to-roll process. As compared to rigid substrates, roll-to-roll processing of thin flexible substrates allows for the use of relatively compact, less expensive vacuum systems, and of some non-specialized equipment that already has been developed for other thin-film industries. Flexible substrate materials inherently have lower heat capacity than glass, so that the amount of energy required to elevate the temperature is minimized. They also exhibit a relatively high tolerance to rapid heating and cooling and to large thermal gradients, resulting in a low likelihood of fracture or failure during processing. Additionally, once active PV materials are deposited onto flexible substrate materials, the resulting unlaminated cells or strings of cells may be shipped to another facility for lamination and/or assembly into flexible or rigid solar modules. This strategic option both reduces the cost of shipping (lightweight flexible substrates vs. glass), and enables the creation of partner-businesses for finishing and marketing PV modules throughout the world. Additional details relating to the composition and manufacture of thin-film PV cells of a type suitable for use with the presently disclosed methods and apparatus may be found, for example, in U.S. Pat. Nos. 6,310,281, 6,372,538, and 7,194,197, all to Wendt et al., and in Provisional Patent Application Ser. No. 61/063,257 filed Jan. 31, 2008. These references are hereby incorporated into the present disclosure by reference for all purposes.

One or more of the layers deposited in a thin-film PV cell typically is a "window layer(s)" that allows usable light to penetrate to the interior of the cell, and which in some cases also may serve as the n-type semiconductor material in the cell. Such a layer also may be referred to in the PV cell field as a "buffer layer." When used both as a window layer and a semiconductor, the buffer layer ideally should be both substantially transparent to light in a desired wavelength range, and also exhibit the appropriate electronic properties. The buffer layer also could consist of multiple window layers acting also as semiconductors, such as a layer of cadmium sulfide followed by a layer of cadmium-zinc sulfide. A thin-film buffer layer with desired properties may be formed through chemical reaction between one or more metals such as zinc, cadmium, lead, mercury, or any metal or combination of metals selected from groups 1b, 2b, or 3a of the Periodic Table of the Elements, and a chalcogen such as oxygen, sulfur, selenium, or tellurium. The resulting compounds are often termed chalcogenides. Suitable window or buffer layer compounds for solar devices may include, for example, cadmium sulfide, zinc sulfide, zinc selenide, cadmium zinc selenide, zinc oxide, and cadmium zinc oxide.

Historically, the formation of a thin-film buffer layer or layers often proceeds by a relatively inefficient cyclical process that includes heating the substrates in a water-containing vessel to an elevated temperature, adding and mixing in a metallic salt, and then adding and mixing in a chalcogen-containing component. After a proscribed time at a proscribed temperature, the reaction is complete, the substrates are removed, the used solution is sent to waste treatment, reactant-containing solution is applied to the web, and the vessel is cleaned for the next reaction. In addition, existing methods of applying the reactant-containing solution to the web typically result in deposition of chalcogenide over both the desired ("front" or "top") surface of the web, and also over at least a portion of the other ("back" or "bottom") surface of the web, requiring at least one cleaning step to remove the material from the back surface. This is typically accomplished with an acidic solution that must be carefully controlled and completely removed to avoid damage to the desired thin-film layers and to avoid long-term corrosion issues activated by the presence of residual acidity. A sacrificial coating or covering for the back or bottom surface of the substrate web may also potentially be used to protect the back side from undesirable chalcogenide coverage, but such a coating requires additional cleanup and may result in excessive cost.

FIG. 1 shows a top view of a thin-film photovoltaic cell 10, in accordance with aspects of the present disclosure. Cell 10 is substantially planar, and typically rectangular as depicted in FIG. 1, although shapes other than rectangular may be more suitable for specific applications, such as for an odd-shaped rooftop or other surface. The cell has a top surface 12, a bottom surface 14 opposite the top surface, and dimensions including a length L, a width W, and a thickness. The length and width may be chosen for convenient application of the cells and/or for convenience during processing, and typically are in the range of a few centimeters (cm) to tens of cm. For example, the length may be approximately 100 millimeters (mm), and the width may be approximately 210 mm, although any other suitable dimensions may be chosen. The edges spanning the width of the cell may be characterized respectively as a leading edge 16 and a trailing edge 18. The total thickness of cell 10 depends on the particular layers chosen for the cell, and is typically dominated by the thickness of the underlying substrate of the cell. For example, a stainless steel substrate may have thickness on the order of 0.025 mm (25 microns), whereas all of the other layers of the cell (not including an upper collection grid) may have a combined thickness on the order of approximately 0.0025 mm (2.5 microns) or less.

Cell 10 is created by starting with a flexible substrate, and then sequentially depositing multiple thin layers of different materials onto the substrate. This assembly may be accomplished through a roll-to-roll process whereby the substrate travels from a pay-out roll to a take-up roll, traveling through a series of deposition regions between the two rolls. The PV material then may be cut to cells of any desired size. The substrate material in a roll-to-roll process is generally thin, flexible, and can tolerate a relatively high-temperature environment. Suitable materials include, for example, a high temperature polymer such as polyimide, or a thin metal such as stainless steel or titanium, among others. Sequential layers typically are deposited onto the substrate in individual processing chambers by various processes such as sputtering, evaporation, vacuum deposition, chemical deposition, and/or printing. These layers may include a molybdenum (Mo) or chromium/molybdenum (Cr/Mo) back contact layer; an absorber layer of material such as copper indium diselenide, copper indium disulfide, copper indium aluminum diselenide, or copper indium gallium diselenide (GIGS); a buffer layer or layers such as a layer of cadmium sulfide (CdS); and a transparent conducting oxide (TCO) layer acting as the top electrode of the PV cell. In addition, a conductive current collection grid, usually constructed primarily from silver (Ag) or some other conductive metal, is typically applied over the TCO layer.

Although the precise thickness of each layer of a thin-film PV cell depends on the exact choice of materials and on the particular application process chosen for forming each layer, exemplary materials, thicknesses and methods of application of each layer described above are as follows, proceeding in typical order of application of each layer onto the substrate:

| Layer Description | Exemplary Material | Exemplary Thickness | Exemplary Method of Application |
|---|---|---|---|
| Substrate | Stainless steel | 25 μm | N/A (stock material) |
| Back contact | Mo | 320 nm | Sputtering |
| Absorber | CIGS | 1700 nm | Evaporation |
| Buffer | CdS | 80 nm | Chemical deposition |
| Front electrode | TCO | 250 nm | Sputtering |
| Collection grid | Ag | 40 μm | Printing |

The remainder of this disclosure focuses on various methods and apparatus for forming the buffer layer(s).

II. Feedback Mechanism

This section describes methods and apparatus for dispensing reactant solutions onto a PV cell web to form a chalcogenide buffer layer on the web, measuring one or more properties of the buffer layer and/or the PV cell including the deposited buffer layer, and adjusting one or more parameters of the buffer layer formation apparatus or method in response to the measurement(s).

Figure 2:
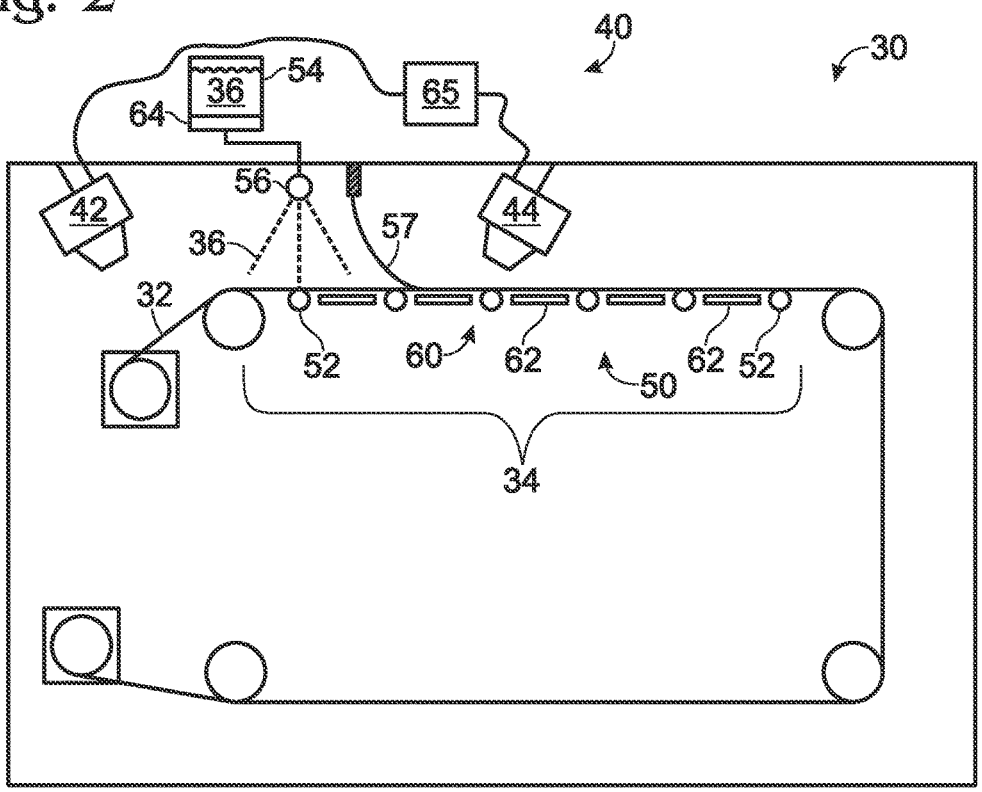
FIG. 2 is a schematic side view of an apparatus for forming a thin-film layer on a substrate web, showing an exemplary feedback mechanism configured to evaluate a property of the web.

According to aspects of the present disclosure, a buffer layer may be applied to the underlying PV cell layers (typically a bottom substrate layer, a back contact layer, and an absorber layer) via a chemical deposition process. As shown in FIG. 2, the process involves an apparatus 30 for transporting a web 32 of thin film substrate material through a deposition region 34, and dispensing one or more reactant solutions 36 onto the top surface of the web within the deposition region. To react and form a suitable chalcogenide, the reactant solution(s) should contain, at a minimum, at least one metal and at least one chalcogen. In addition, the solution typically will contain a chemical complexant such as ammonia, and deionized water (DI).

Although the system depicted in FIG. 2 transports the web linearly and in a direction corresponding to the longitudinal dimension of the web, the present teachings also contemplate alternative methods of depositing a thin film buffer layer. These alternatives include, for example, solution application onto a concave or convex web disposed on the inside or outside of a drum-like structure, and horizontal web transport using one or a plurality of weirs (such as containers, plates, or rollers) held to a "controlled-drainage" distance from the web to hold the chalcogenide solution against the web for a suitable reaction period.

Suitable metal-containing solutions may contain, for example, copper, silver, gold, zinc, cadmium, mercury, lead, boron, aluminum, gallium, indium, and thallium. Typical metals zinc, cadmium, lead, or mercury, are usually prepared as a salt such as a sulfate, a chloride, a nitrate, or a bicarbonate. For example, cadmium sulfate may be an appropriate metallic salt. The salt typically is combined with a complexant such as ammonia or ammonium hydroxide, and deionized water. Suitable chalcogen-containing solutions may contain a chalcogen such as oxygen, sulfur, selenium, or tellurium, typically prepared as a reagent compound solution such as urea (an example of an oxygen-containing reagent) or thiourea (an example of a sulfur-containing reagent).

In many existing systems for chemically synthesizing a thin-film chalcogenide buffer layer, the properties of the deposited buffer layer, or of the cell including the newly deposited layer, are measured only after a relatively large quantity of PV cell material has been either partially or completely formed. Thus, in cases where the buffer layer or cell is found to have one or more properties that could be improved through adjustment of the apparatus or method of buffer layer formation, a large quantity of material may have been created with less than optimal characteristics. Even if the materials produced under such conditions perform well enough to be commercially usable, they may reduce the average performance of the PV module into which they are incorporated. The result is a loss of manufacturing efficiency.

In contrast, according to the present teachings, a feedback mechanism may be provided that is configured to evaluate at least one property of a thin-film chalcogenide buffer layer formed through chemical combination of the dispensed metal and chalcogen, and/or at least one property of the cell including the newly formed layer, and to adjust parameter(s) of the formation system or method based on evaluation of the measurement(s). The evaluation and the response both may be performed in real time, or "on the fly," resulting in faster attainment of improved qualities of the buffer layer, and a commensurate improvement in manufacturing efficiency and average product quality.

As described in more detail below, the measured properties of the chalcogenide buffer layer may include, for example, thickness, uniformity, growth rate, or color of the layer (the latter of which may provide an indirect measure of thickness, uniformity, and/or growth rate). Furthermore, measured properties of the PV cell may include, for example, overall thickness or uniformity, as well as various electronic properties of the cell after deposition of the buffer layer, such as photon absorption in various wavelength ranges, or current production as a function of incident wavelength, among others. In response to any such measurements, the adjusted parameters of the buffer layer deposition method or apparatus may include, for example, speed of the web through the buffer layer deposition region, average temperature and/or longitudinal temperature profile of the underlying web, temperature of one or more preheated reactant solutions, angular disposition of the web, or concavity of the web.

An exemplary feedback mechanism configured to measure one or more properties of the chalcogenide buffer layer is generally indicated at 40 in FIG. 2. As depicted in FIG. 2, exemplary feedback mechanism 40 includes a pair of cameras 42, 44 for digitally capturing images of the PV cell before and after chemical formation of the chalcogenide buffer layer. In the depicted embodiment of FIG. 2, camera 42 is configured for digitally capturing images of the web prior to formation of the chalcogenide buffer layer, and camera 44 is configured for digitally capturing images of the web after formation of the chalcogenide buffer layer, whether before or after rinsing or drying of the web. As a result, measuring one or more properties of the buffer layer may be performed by comparing an image captured by the second camera with an image captured by the first camera. These cameras or other measuring devices are not limited to the positions depicted in FIG. 2, but may be located at any desired locations in the proximity of the substrate web. For example, a camera or other measuring instrument may be disposed to capture images of the web after the web has been collected by a take-up reel. It should also be appreciated that a property of the buffer layer may be measured and evaluated with only a single measuring instrument, such as a single camera 44 located at any position within or beyond the deposition region. In this case, the single instrument may measure properties such as a ratio of colors (for example, the ratio of red light intensity to green+blue light intensity), a reflectivity, or any other suitable property that may indicate the thickness and/or uniformity of a deposited chalcogenide layer.

Cameras 42, 44 each may supply images to a digital processor 65, which evaluates the images based on properties of the images such as color, ratios of selected colors, reflectivity (i.e. intensity of reflected light), interference effects and/or uniformity, and determines one or more properties of the web or buffer layer based on the image properties. For example, image color recorded by camera 44, or the difference in image color between image color recorded by camera 44 and camera 42, may provide a measure of the thickness of the deposited chalcogenide layer. Similarly, uniformity of any aspect of the images captured by camera 44 (including color and intensity), or the difference in uniformity between some aspect of the images captured by camera 44 and that same aspect of the images captured by camera 42, may provide a measure of the uniformity of the deposited chalcogenide layer. In general, any aspect of the images captured by cameras 42, 44 may be evaluated or compared, to infer or deduce one or more properties of the buffer layer. The sensitivity of the system may be enhanced by using a suitable wavelength filter in front of the camera lens, or a specialty camera with higher response in the wavelength range of most interest. As noted above, the evaluation may be performed by a computer processor to which image data from the cameras is transmitted.

Aside from cameras 42, 44 depicted in FIG. 2, other instruments or devices may be used to evaluate properties of the buffer layer, or the PV cell including the buffer layer, as part of a feedback mechanism that may or may not include cameras. For example, one or more light sources may be used to illuminate the web, before and/or after application of the buffer layer, either to provide a measure of reflectivity in specific wavelength bands, or simply to allow better capture of digital images. Such light sources also may be provided as part of one or more interferometers, which may be configured to measure the thickness and/or uniformity of the buffer layer in accordance with well-known physical principles. Interferometers may be used either alternatively or in addition to cameras. Light sources also may be used in conjunction with dedicated reflectometers, which may be configured to measure the amount of light reflected from the chalcogenide film over a range of wavelengths with the incident light approximately normal to the web surface, to determine the thickness of the chalcogenide layer in accordance with the principles of thin-film interference.

In addition, temperature sensors (such as infrared detectors) may be provided as part of the feedback mechanism, to measure the temperature of the web at various positions both before and after one or more reactant solutions are dispensed. For example, temperature sensors may be used to ensure that each dispensed solution has a temperature greater than the temperature of the web prior to application of the solution. Temperature may be detected alternatively or in addition to other properties of the web. An x-ray fluoroscope, including both an x-ray source and a detector for detecting secondary (fluorescent) x-rays, also may be provided and used to determine properties of the chalcogenide film.

In addition to instruments designed to measure tangible physical properties of the buffer layer such as its thickness or uniformity, a feedback mechanism according to the present disclosure also may include instruments configured to measure one or more electronic properties of the PV cell, before and/or after deposition of the buffer layer. For example, a photon absorption rate or fraction by the web may be measured, either directly or through a measurement of current amplitude induced in the PV cell by incident photons. Such measurements may be made over broad wavelength bandwidths, may be taken for certain specific wavelength regimes, corresponding to typical solar wavelengths or to regimes in which PV cell performance is particularly desirable. For instance, the current induced by absorption of near ultraviolet photons may be of particular interest in the construction of an efficient PV cell, because such absorption is particularly sensitive to the thickness of the chalcogenide buffer layer of the cell.

Any properties measured by the feedback mechanism, which as described above may include any suitable light sources and/or measuring sensors or instruments, may be characterized as functions of the width of the PV web (i.e., across its transverse dimension), as functions of the length of the PV web (i.e., in the longitudinal dimension), or both. A measurement may indicate substantial uniformity of the measured property in either or both dimensions to a desired degree, while still indicating an overall deficiency in some regard, such as an excess of thickness of the buffer layer. Alternatively or in addition, a measurement may indicate undesirable variations from a desired degree of uniformity of the measured property. Variations in properties across the width of the web may indicate, for example, a lack of symmetry and/or an excess of concavity or convexity in the transverse dimension, whereas variations in properties along the length of the web may indicate that various aspects of the buffer layer deposition method or apparatus are changing, or have changed, over time or as functions of longitudinal position within the chalcogenide deposition region. As described below, detection of overall deficiencies, as well as detection of variations from uniformity in either dimension, may allow for corrections that can improve the quality of the final PV cell. Furthermore, these deficiencies can be mapped or otherwise recorded to enable later process steps to utilize this information to speed up the deposition process (that is, skipping over, rejecting, or modifying the later process to offset the deficiency).

Various parameters of the buffer layer deposition methods and apparatus may be adjusted in response to the measurements described above, to attain a chalcogenide buffer layer with a desired degree of thickness, uniformity, photon absorption, and/or any other desired properties of the buffer layer. These adjustable parameters include at least the following:

(i) speed of the web through the deposition region;
(ii) concentration of the metal-containing and/or chalcogen-containing solutions;
(iii) average temperature of the web in the deposition region;
(iv) height of one or more lateral edge portions of the web (i.e., lateral slope of the web);
(v) temperature of the metal-containing and/or chalcogen-containing solutions prior to dispensing the solutions onto the web;
(vi) dispensing rate of the metal-containing and/or chalcogen-containing solutions onto the web;
(vii) height of one or more longitudinal ends of the web in the deposition region (i.e., longitudinal slope of the web);
(viii) concavity of the web in the deposition region; and
(ix) degree of spreading of the reactant solutions on the web.

For example, in response to a direct or indirect measurement indicating that the buffer layer is either undesirably thick or undesirably thin, the thickness of the layer may be altered through adjustment of the speed of transport of the web through the deposition region, the concentrations of the reactants in the reactant solution(s), the flow rates of reactants to the deposition area, the longitudinal temperature profile of the web, the temperature of the various solutions dispensed onto the web, and/or the longitudinal slope of the web. Similarly, for example, in response to a measurement indicating that the buffer layer is asymmetric across the transverse dimension of the web, the transverse temperature profile of the web and/or the height of one or both lateral edge portions of the web may be adjusted until a desired level of symmetry is attained. In response to a measurement indicating that the buffer layer is undesirably non-uniform in some other manner, such as too thick only in the central region of the web or periodically changing thickness across the transverse dimension of the web, measures may be taken such as adjusting the concavity of the web and/or more effectively spreading the reactant solutions on the web surface. Similarly, any measured property indicating a possible improvement in the characteristics of the PV cell may result in a responsive adjustment of one or more parameters of the system.

Apparatus 30 includes a transport mechanism, generally indicated at 50, for conveying a continuous flexible web of substrate material through the deposition region in the longitudinal region. Transport mechanism 50 may take various forms, such as one or more continuous belts that may convey the web while supporting it either from above or below, or a series of rollers, such as 16 or more, upon which the web rests and is conveyed. FIG. 2 depicts a transport mechanism that includes a plurality of synchronized transport rollers 52. Rollers 52 may be substantially evenly spaced, as shown in FIG. 2, or they may be unevenly spaced to accommodate other desired elements of the apparatus. To ensure that the web is transported through the deposition region at a uniform speed along its length, rollers 52 may be synchronized by any suitable method. For example, the rollers all may be driven by a single rotating shaft, with each roller linked to the common shaft. The rollers may be linked to the shaft by a standard gear/screw linking mechanism (not shown) or by any other linking mechanism. In an alternative embodiment, the support rollers may not rotate at all, but rather may be stationary, precision leveled cross pieces.

Apparatus 30 also may include various supplies of the reactant solutions, which can include supply vessels for mixing, storing, and/or providing the various solutions. For example, FIG. 2 depicts a first supply vessel 54 containing a supply of reactant solution 36, which could include a metallic salt solution such as a cadmium salt solution, and/or a chalcogen solution such as a thiourea solution. If only one of the metal-containing solution and the chalcogen-containing solution is supplied from a single source, another source (not shown) would be provided for the other solution. Furthermore, a plurality of additional solution sources such as supply vessels also may be provided, including a vessel containing a supply of an alternative metallic solution, a vessel containing a supply of ammonium hydroxide or another suitable complexant solution, and a vessel containing a supply of deionized water. Alternative, two or more of these solutions may be combined within a single supply vessel, and any or all of the solution may be provided from a source external to apparatus 30. Each of the supply vessels may be constructed in any suitable manner and from any suitable materials, provided the vessels are resistant to corrosion by the chemical compound or mixture of compounds they are intended to contain.

The various solutions described above may be applied (or dispensed) onto the web by solution dispensers. For example, as depicted in FIG. 2, a solution dispenser 56 may be configured to dispense solution 36 onto the web. One or more additional solution dispensers, not shown, may be configured to dispense additional solutions. The solution dispensers typically will be disposed above the web, at longitudinal positions corresponding to the desired locations for applying the associated solutions. The dispensers may have any suitable construction allowing application of solution in a sufficiently uniform manner across the transverse dimension of the web and at a desired flow rate. For instance, a pressurized manifold having a plurality of apertures extending above and across the transverse dimension of the web may be suitable.

Because the chalcogenide-forming chemical reaction between a metal-containing solution and a chalcogen-containing solution typically requires a minimum temperature for a suitable reaction rate, one or more heaters may be provided to supply heat to the substrate web and/or to the solutions. For example, a heating mechanism, generally indicated at 60 in FIG. 2, may be configured to heat the web substantially uniformly in the deposition region. Web heating mechanism 60 may, for example, include a plurality of discrete heaters 62 for heating the web. The heaters may be disposed in any convenient location in proximity to the web. For example, they may be disposed below the web and between adjacent pairs of rollers 52. Heaters 62 may extend substantially across the transverse dimension of the web, to heat the web substantially uniformly. In addition, as depicted in FIG. 2, the heaters may be positioned out of physical contact with the web, to provide heat to the web substantially nonconductively.

In some embodiments, solution application may be configured such that little or no heating of the web is required, aside from heating the web with the applied reactant solution(s). That is, if the metal-containing solution and/or the chalcogen-containing solution are sufficiently hot, then the mere combination of the solutions can be sufficient to start the chalcogenide reaction. If heat losses are sufficiently controlled, the reaction can continue to substantial completion without any additional heating of the solutions or the web. This may be accomplished if one or both of metal-containing solution and the chalcogen-containing solution are preheated, for example by one or more heaters such as solution preheater 64 depicted in FIG. 2. In some cases, all of the applied solutions may be preheated to a temperature in excess of the web temperature, and their temperatures upon application to the web may be monitored by one or more infrared sensors (not shown). In such embodiments, the temperature of the web may be monitored at any or all locations both prior and subsequent to application of each solution. In some cases, the solutions may be preheated enough to substantially provide the heat of chalcogenide reaction, and web heaters such as heaters 62 may be used merely to maintain and/or make minor adjustments to the temperature in the deposition region.

To adjust the lateral slope of the web, the height of one or more lateral edge portions 68 of the web may be adjusted. As described previously, such an adjustment may be appropriate if it is determined that the chalcogenide buffer layer is being formed asymmetrically across the later dimension of the substrate. One way to adjust the height of a lateral edge portion of the web is to perform what can be termed a global adjustment, whereby the entire web is laterally tilted. This may be accomplished, for example, by adjusting leveling "feet" of the buffer layer deposition apparatus (in much the same way that a desk or table is leveled), or by adjusting the lateral slope of the deposition region within the apparatus in a similar manner, but without tilting the entire external frame of the apparatus. Alternatively, a local adjustment of the lateral slope may be made, whereby the lateral slope in only a particular portion of the deposition zone is adjusted. This may be accomplished, for example, by individually adjusting the vertical height of one or more lateral support structures 66 that support lateral edges 68 of the web (see FIGS. 3-4). These lateral support structures may take the form of frustoconical or alternately shaped rotatable bearings, or they may be non-rotatable structures of any suitable shape for supporting the edge portions of the web in a desirable manner.

Similarly, an adjustment of the longitudinal slope of the web may be made either globally or locally. A global adjustment of longitudinal slope involves tilting the entire web longitudinally, either by adjusting the leveling "feet" or other similar leveling mechanism at one longitudinal end of the apparatus, or by making a similar adjustment within the interior of the apparatus, e.g. by adjusting the vertical height of one of support rollers 52. A local adjustment of longitudinal slope of the web may by accomplished, for example, by making several different adjustments to the vertical heights of support rollers 52 and/or pairs of the lateral support structures, to change the longitudinal slope of the web by different amounts in different portions of the deposition region.

Figure 5:
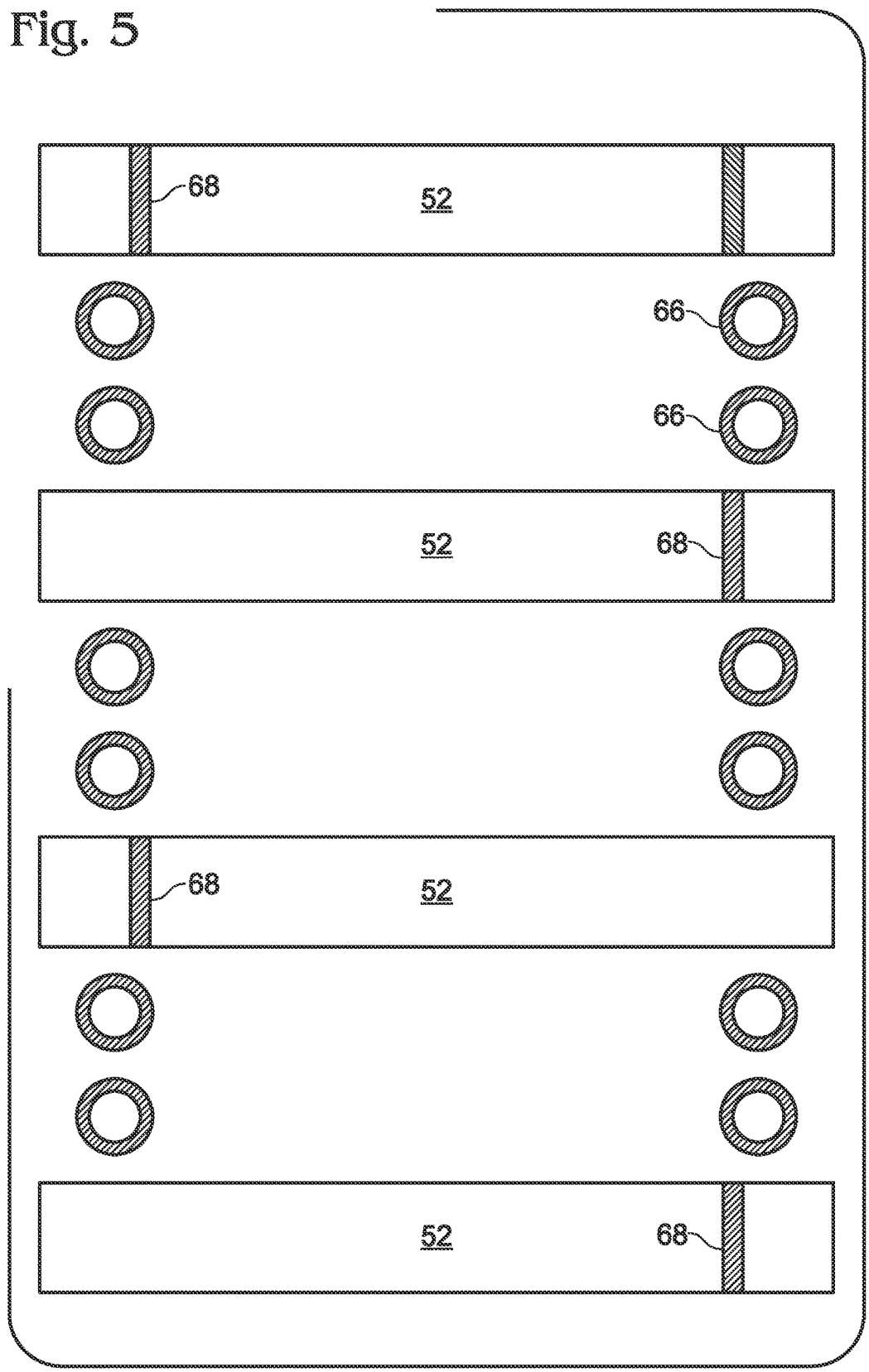
FIG. 5 is a schematic plan view of portions of an apparatus for transporting a substrate web through a deposition region, showing the relative arrangement of transport rollers, lateral support portions, and hold-down mechanisms.

To adjust concavity of the web, the lateral edge portions of the web may be raised as described above, and/or the tension in one or more hold-down structures 68 (see FIG. 5) may be adjusted. Hold-down structures 68 are configured to hold the web in contact with support rollers 52 and thus, a lesser tension in the hold-down structures will typically lead to a greater concavity (or lesser convexity) of the web, and a greater tension in the hold-down structures will typically lead to a lesser concavity (or greater convexity) of the web. The hold-down structures may take the form of rotatable rollers, wheels or any other structures configured to hold the web in contact with the transport mechanism, where each hold-down structure is configured to hold the web in contact with a portion of an associated one of the transport rollers. The hold-down structures, such as wheels or rollers, may be disposed near each edge portion of each transport roller or, as FIG. 5 depicts, the hold-down structures may be disposed in an alternating arrangement, with one hold-down structure disposed near a single edge portion of each transport roller. In general, any arrangement of the hold-down structures may be suitable, provided that the structures are sufficient to hold the web under sufficient tension so that its central portion maintains a desired transverse profile.

Aside from exerting downward forces to hold the web in contact with the transport rollers, the hold-down structures may have various other useful features. For instance, the hold-down structures may be angled slightly outwardly from top to bottom (not shown), to exert forces against the web that have an outward component relative to the central portion of the web. This outward component of force, when exerted at opposing edge portions of the web, helps to hold the central portion of the web flat, which in turn facilitates a relatively even distribution of the buffer layer reactants (and thus, of the buffer layer itself) across the transverse dimension of the web. Furthermore, the hold-down structures may be angled slightly inwardly or outwardly relative to the longitudinal dimension of the web, either of which also may provide helpful outward forces to the web. Both of the aforementioned angles may be adjustable to some extent, to allow for variation of the side-to-side tension in the web and/or the transverse profile of the web.

FIG. 6 is a flow chart depicting a method, generally indicated at 100, of depositing a thin-film chalcogenide buffer layer onto a flexible substrate according to aspects of the present teachings. At step 102, a web of thin-film substrate material is transported through a deposition region in a longitudinal direction. As described above, the substrate material may include a base substrate, such as a thin sheet of stainless steel, upon which one or more thin-film layers have already been deposited. For example, a back contact layer constructed from a material such as molybdenum, and a p-type absorber layer constructed from a material such as CIGS, may already have been deposited on the base substrate. It should be understood that the substrate web may include these layers when it is transported through the deposition region. The web will generally be transported in a roll-to-roll or other similar process, in which case the longitudinal direction will be the direction of travel between the pay-out roll and the take-up roll.

The substrate web may be rinsed with deionized water or some other suitable solution. This rinsing step may be referred to as "pre-rinsing" because it is generally performed prior to application of the chalcogenide-forming solutions to the web. The pre-rinsing step may remove surface irregularities or other artifacts left over from a prior deposition process (such as CIGS deposition), and thus provide a relatively more consistent surface for chalcogenide deposition. One or more chalcogenide-forming solutions may be heated, in some cases to a temperature sufficient to substantially provide the heat for chalcogenide reaction, prior to being dispensed onto the web. One such chalcogenide-forming solution is a metal-containing solution. This solution contains a metal known to react with a chalcogen to form chalcogenide, and thus will generally be selected from the group consisting of copper, silver, gold, zinc, cadmium, mercury, lead, boron, aluminum, gallium, indium, and thallium. The metal-containing solution may, for example, be heated to a temperature in the range of 55-80 degrees Celsius, whereas prior to application of the solution, the web may have a temperature in the range of 25-60 degrees Celsius.

At step 104, the metal-containing solution and a chalcogen-containing solution are dispensed onto the web within the deposition region. The chalcogen-containing solution contains a chalcogen selected from the group consisting of oxygen, sulfur, selenium and tellurium, and which is known to react with the metal in the metal-containing solution to form a chalcogenide with desired optical and/or electronic properties. One exemplary combination is for cadmium to combine with sulfur to produce a cadmium sulfide buffer layer, but other chalcogenides may be suitable as buffer layers and/or n-type semiconductor layers. It should be appreciated that dispensing the chalcogen-containing solution may be performed before, after, or simultaneously with dispensing the metal-containing solution.

It should also be appreciated that the metal-containing solution and the chalcogen-containing solution may be dispensed at any two desired positions within the deposition region. For example, the chalcogen-containing solution may be dispensed beyond the position at which the metal-containing solution is dispensed by a sufficient distance in the longitudinal direction, such as one inch or more, to allow appreciable surface ion exchange between the metal in the metal-containing solution and an underlying layer of photovoltaic material. This may have beneficial effects upon the electronic properties of the underlying semiconductor layer (such as a CIGS layer) of the PV cell. Alternatively, the first and second positions may be substantially coincidental, i.e. the metal-containing solution and the chalcogen-containing solution may be dispensed at substantially the same longitudinal position on the substrate web, as depicted in FIG. 2. The metal-containing and chalcogen-containing solutions may be dispensed by one or more dispensers similar to one of dispensers 56 described previously with respect to FIG. 2, but it should be appreciated that any suitable means of dispensing a solution falls within the scope of the present teachings.

In some cases, the metal-containing solution and/or the chalcogen-containing solution may be distributed across the transverse dimension of the web by passing the solution under a solution spreader such as spreader 57 depicted in FIG. 2, which can take the form of a flexible polymer sheet extending laterally across the deposition region. Distributing one or more of the reactant solutions in this manner can lead to formation of a more uniform chalcogenide layer. However, it should be appreciated that distributing the solutions may be accomplished through other means and may be omitted entirely, in cases where a sufficiently uniform solution distribution is achieved simply through dispensing the solutions appropriately.

At step 106, at least one property of a chalcogenide buffer layer formed on the web through chemical combination of the metal-containing solution and the chalcogen-containing solution is measured. The measured properties may include, for example, thickness of the chalcogenide buffer layer, uniformity of the buffer layer in the lateral and/or longitudinal direction, color of the layer, photon absorption by the layer, reflectivity of the layer, thin-film interference by the layer, or any other measurable optical, physical or electronic property. The measurement may be accomplished through the use of one or more sensing instruments such as cameras, interferometers, temperature sensors, or the like, positioned in proximity to the web. The measurement may be assisted through a comparison of the web properties before and after chalcogenide deposition (in which case two or more sensors will typically be used), and through the use of a digital processor configured to receive and process data collected by the measuring instrument(s) and to convert the data into a useful measurement.

At step 108, one or more parameters of the chalcogenide deposition process are adjusted in response to the measurement made in step 106. These parameters include all of those discussed previously, such as speed of the web through the deposition region; concentration of the metal-containing and/or chalcogen-containing solutions; average temperature of the web in the deposition region; height of one or more lateral edge portions of the web (i.e., lateral slope of the web); temperature of the metal-containing and/or chalcogen-containing solutions prior to dispensing the solutions onto the web; dispensing rate of the metal-containing and/or chalcogen-containing solutions onto the web; height of one or more longitudinal ends of the web in the deposition region (i.e., longitudinal slope of the web); concavity of the web in the deposition region; and degree of spreading of the reactant solutions on the web. These adjustments may be made manually by an operator, or may be controlled by a processor configured to respond when one or more properties of the chalcogenide layer fall outside predetermined limits. It should also be understood that various semi-automatic methods are possible, such as an alarm controlled by a processor and triggered when an undesirable property of the buffer layer is sensed, which signals an operator to make a manual adjustment to the deposition method or apparatus.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following numbered claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original numbered claims that follow, also are regarded as included within the subject matter of the inventions of the present disclosure.

What is claimed is:

1. A method of depositing a thin film chalcogenide buffer layer onto a flexible substrate, comprising:
   transporting a web of thin film substrate material through a deposition region by passing the web over a transport mechanism disposed within the deposition region;
   dispensing onto a top surface of the web a metal-containing solution containing a metal chosen from the group consisting of copper, silver, gold, zinc, cadmium, mercury, lead, boron, aluminum, gallium, indium and thallium, and a chalcogen-containing solution containing a chalcogen chosen from the group consisting of oxygen, sulfur, selenium and tellurium;
   lifting transverse edge portions of the web relative to a central portion of the web to contain at least a portion of the metal-containing solution and at least a portion of the chalcogen-containing solution substantially upon the top surface of the web; and
   holding the central portion of the web substantially flat;
   wherein holding the central portion of the web substantially flat includes holding the web in contact with the transport mechanism at discrete positions within the deposition region by passing the web underneath a plurality of wheels, each wheel disposed directly above a portion of the transport mechanism and between the central portion and one of the lifted transverse edge portions of the web, and configured to hold the web in contact with that portion of the transport mechanism; and
   wherein the wheels are disposed above the transport mechanism in an alternating arrangement, with successive wheels disposed near alternating edges of the transport mechanism.

2. The method of claim 1, wherein the transport mechanism is configured to transport the web out of physical contact with a web heating mechanism.

3. The method of claim 1, wherein the transport mechanism has concave edge portions, and wherein lifting the transverse edge portions of the web includes passing the web over the concave edge portions of the transport mechanism.

4. The method of claim 1, wherein the wheels are configured to supply an adjustable force to the web.

5. The method of claim 1, wherein the wheels are configured to supply a force having both downward and outward components to the web.

6. The method of claim 1, wherein lifting the transverse edge portions includes contacting each edge portion with a lifting structure shaped to conform to the lifted edge portion.

7. The method of claim 6, wherein each lifting structure includes a concave lifting portion.

8. The method of claim 6, wherein each lifting structure includes a substantially planar lifting portion angled away from the central portion of the web.

9. The method of claim 6, wherein each lifting structure includes a substantially planar lifting portion angled away from the central portion of the web.

10. The method of claim 1, wherein lifting the transverse edge portions is adjustable within a range of lift amounts.

11. A method of depositing a thin film cadmium sulfide semiconductor layer onto a flexible substrate, comprising:
    transporting a web of thin film substrate material through a deposition region by passing the web over a transport mechanism disposed within the deposition region;
    dispensing onto a top surface of the web a cadmium-containing solution and a sulfur-containing solution;
    lifting transverse edge portions of the web relative to a central portion of the web to contain at least a portion of the cadmium-containing solution and at least a portion of the sulfur-containing solution substantially upon the top surface of the web; and
    holding the central portion of the web substantially flat by passing the web underneath a plurality of wheels, each wheel disposed directly above a portion of the transport mechanism and between the central portion and one of the lifted transverse edge portions of the web, and configured to hold the web in contact with that portion of the transport mechanism;
    wherein the wheels are disposed above the transport mechanism in an alternating arrangement, with successive wheels disposed near alternating edges of the transport mechanism.

12. The method of claim 11, wherein the transport mechanism is configured to transport the web out of physical contact with a web heating mechanism.

13. The method of claim 11, wherein the transport mechanism has concave edge portions, and wherein lifting the transverse edge portions of the web includes passing the web over the concave edge portions of the transport mechanism.

14. The method of claim 11, wherein the wheels are configured to supply an adjustable force to the web.

15. The method of claim 11, wherein the wheels are configured to supply a force having both downward and outward components to the web.

16. The method of claim 11, wherein lifting the transverse edge portions includes contacting each edge portion with a lifting structure shaped to conform to the lifted edge portion.

17. The method of claim 16, wherein each lifting structure includes a concave lifting portion.

18. A method of depositing a thin film semiconductor layer onto a flexible substrate, comprising:
    transporting a web of thin film substrate material through a deposition region by passing the web over a transport mechanism disposed within the deposition region;
    dispensing onto a top surface of the web a cadmium-containing solution and a sulfur-containing solution;
    providing heat sufficient to cause the cadmium-containing solution and the sulfur-containing solution to react to form a chalcogenide;
    lifting transverse edge portions of the web relative to a central portion of the web to contain at least a portion of the cadmium-containing solution and at least a portion of the sulfur-containing solution substantially upon the top surface of the web; and
    holding the central portion of the web substantially flat by passing the web underneath a plurality of wheels, each wheel disposed directly above a portion of the transport mechanism between the central portion and one of the lifted transverse edge portions of the web, and configured to hold the web in contact with that portion of the transport mechanism;

wherein the wheels are disposed above the transport mechanism in an alternating arrangement, with successive wheels disposed near alternating edges of the transport mechanism.

* * * * *